United States Patent
Viraraghavan et al.

(10) Patent No.: US 9,859,177 B2
(45) Date of Patent: Jan. 2, 2018

(54) TEST METHOD AND STRUCTURE FOR INTEGRATED CIRCUITS BEFORE COMPLETE METALIZATION

(71) Applicant: GLOBALFOUNDRIES INC., Grand Cayman (KY)

(72) Inventors: Janakiraman Viraraghavan, Bengaluru (IN); Ramesh Raghavan, Bengaluru (IN); Balaji Jayaraman, Bengaluru (IN); Thejas Kempanna, Bengaluru (IN); Rajesh R. Tummuru, Bengaluru (IN); Toshiaki Kirihata, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/062,484

(22) Filed: Mar. 7, 2016

(65) Prior Publication Data
US 2017/0256468 A1 Sep. 7, 2017

(51) Int. Cl.
*G11C 7/00* (2006.01)
*H01L 21/66* (2006.01)
(Continued)

(52) U.S. Cl.
CPC .............. *H01L 22/32* (2013.01); *H01L 22/14* (2013.01); *H01L 22/22* (2013.01);
(Continued)

(58) Field of Classification Search
CPC ......... H01L 22/32; H01L 22/14; H01L 22/22; H01L 27/115; H01L 27/1052; H01L 28/40
(Continued)

(56) References Cited

U.S. PATENT DOCUMENTS

| | | | | |
|---|---|---|---|---|
| 6,054,334 A | * | 4/2000 | Ma | H01L 22/32 257/E23.02 |
| 6,181,004 B1 | * | 1/2001 | Koontz | H05K 1/0216 257/664 |

(Continued)

OTHER PUBLICATIONS

Calder et al., "Activation of polysilicon connections by selective CW laser annealing," IEEE Electron Device Letters. 6 (10):557-9 (1985).

(Continued)

*Primary Examiner* — Viet Q Nguyen
(74) *Attorney, Agent, or Firm* — Michael Le Strange; Hoffman Warnick LLC (57) ABSTRACT

Aspects of the present disclosure include methods and test structures for an intermediate metal level of an integrated circuit (IC). A method according to the present disclosure can include: fabricating a first plurality of metal levels including an intermediate metal level of an IC structure, the intermediate metal level being one of a plurality of metal levels in the IC structure other than a capping metal level of the IC structure; performing a first functional test on a first circuit positioned within the intermediate metal level; fabricating a second plurality of metal levels after performing the first functional test, the second plurality of metal levels including the capping metal level of the IC structure; and performing a second functional test on a second circuit positioned within the plurality of metal levels, after the fabricating of the capping metal level.

16 Claims, 8 Drawing Sheets

(51) Int. Cl.
  *H01L 27/115* (2017.01)
  *H01L 27/105* (2006.01)
  *H01L 49/02* (2006.01)

(52) U.S. Cl.
  CPC ........ *H01L 27/1052* (2013.01); *H01L 27/115* (2013.01); *H01L 28/40* (2013.01)

(58) Field of Classification Search
  USPC ........................................................ 365/200
  See application file for complete search history.

(56) References Cited

U.S. PATENT DOCUMENTS

| | | | | |
|---|---|---|---|---|
| 6,423,558 | B1* | 7/2002 | Maeda | H01L 22/20 257/E21.525 |
| 6,597,187 | B2* | 7/2003 | Eldridge | G01R 1/07307 257/E23.079 |
| 7,047,514 | B2* | 5/2006 | Mizuno | H01L 27/118 257/E27.105 |
| 7,068,058 | B2* | 6/2006 | Park | H01L 22/34 257/508 |
| 7,515,502 | B1 | 4/2009 | Ahsan et al. | |
| 7,786,475 | B2* | 8/2010 | Kulkarni | G01R 31/31717 257/48 |
| 8,713,769 | B2* | 5/2014 | Dudnikov | H01G 4/06 29/25.41 |
| 9,190,392 | B1* | 11/2015 | Shinde | H01L 23/48 |
| 9,599,670 | B2* | 3/2017 | Goel | G01R 31/31851 |
| 2003/0173987 | A1* | 9/2003 | Frankowsky | G01R 31/2831 324/754.03 |
| 2009/0201038 | A1* | 8/2009 | Knickerbocker | G01R 1/07314 324/762.05 |
| 2011/0049513 | A1* | 3/2011 | Yamanaka | H01L 22/32 257/48 |

OTHER PUBLICATIONS

Komano et al., "Focused-ion-beam fuse cutting for redundancy technology," IEEE Transactions on Electron Devices. 35(7):899-903 (1988).

Harter, "Three-Dimensional Integrated Circuit Layout" Section 1.4.5 Wafer-scale integration. Cambridge University Press, Cambridge, 1991 (pp. 11-12).

* cited by examiner

TEST METHOD AND STRUCTURE FOR INTEGRATED CIRCUITS BEFORE COMPLETE METALIZATION

BACKGROUND

The subject matter disclosed herein relates to testing integrated circuits (ICs) during fabrication. More specifically, embodiments of the present disclosure relate to methods and test structures for testing at intermediate metal levels of an IC.

Each IC can be made up of billions of interconnected devices, such as transistors, resistors, capacitors, and diodes, located on one or more chips of semiconductor substrate material. The quality and viability of a product including an IC can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of a first "metal level," i.e., a metal wire for connecting several semiconductor devices together. BEOL generally includes fabrication processes following the formation of the first metal level, including the formation of all subsequent metal levels. To provide greater scaling and sophistication of the fabricated device, the number of metal levels can be varied to suit a particular application, e.g., by providing four to six metal levels, or as many as, in a further example, sixteen or more metal levels.

Products which include ICs therein must be tested before being provided to an end user. Conventionally, all metal levels of an IC chip must be fabricated before testing occurs, e.g., to provide enough electrical connections for the product to operate according to its specifications. Some design constraints or testing procedures can limit the number of detectable defects during a test after all metal levels in an IC chip have been fabricated. In some cases, one or more dedicated test structures can be embedded in an IC during manufacture to increase the number of testing variations and the amount of information yielded from a test. For example, a portion of each memory cell in the IC can be electrically coupled to a test switch to test each memory cell in alternating modes. Structurally incorporating multiple test switches into an IC chip can be disadvantageous because these structures greatly increase the amount of surface area occupied by test hardware. A fabricator may not be able to remove these structures or electrically couple them to other portions of the IC to provide different functions.

BRIEF SUMMARY

A first embodiment of the present disclosure provides a method including: fabricating a first plurality of metal levels including an intermediate metal level of an IC structure, the intermediate metal level being one of a plurality of metal levels in the IC structure other than a capping metal level of the IC structure; performing a first functional test on a first circuit positioned within the intermediate metal level; fabricating a second plurality of metal levels after performing the first functional test, the second plurality of metal levels including the capping metal level of the IC structure; and performing a second functional test on a second circuit positioned within the plurality of metal levels, after the fabricating of the capping metal level.

A second embodiment of the present disclosure provides a test structure positioned in an intermediate metal level of a partially completed integrated circuit (IC) including a plurality of metal levels, the intermediate metal level being one of the plurality of metal levels other than a capping metal level, wherein the test structure includes a memory cell which further includes: a first transistor including a first terminal coupled to a first bit line, a second terminal coupled to a coupling node, and a gate coupled to a word line, and a second transistor including a first terminal coupled to a second bit line, a second terminal coupled to the coupling node, and a gate terminal coupled to the word line, wherein a test circuit of the memory cell includes the word line electrically coupled to the first and second bit lines through the gate of the first and second transistors, wherein a subsequent metal layer of the plurality of metal layers is configured to electrically short the test circuit through the coupling node.

A third embodiment of the present disclosure provides a method including: fabricating a partial IC structure having a first plurality of metal levels, the first plurality of metal levels including a first metal level and at least one intermediate metal level; electrically testing a first circuit within the partial IC structure, wherein the electrically testing of the first circuit includes applying a first test current and a second test current to the first circuit, the second test current having a reversed polarity relative to the first test current; fabricating a second plurality of metal levels on the partial IC structure to yield the completed IC structure, wherein the second plurality of metal levels includes a capping metal level, and wherein the fabricating of the second plurality of metal levels on the partial IC structure yields an electrical short in the first circuit; and electrically testing a second circuit within the completed IC structure after fabricating the second plurality of metal levels, wherein the electrically testing of the second circuit includes applying a test voltage to the second circuit, the second circuit being a circuit of the completed IC structure other than the first circuit.

BRIEF DESCRIPTION OF THE DRAWINGS

These and other features of the present disclosure will be more readily understood from the following detailed description of the various aspects of the disclosure taken in conjunction with the accompanying drawings that depict various embodiments of the disclosure, in which.

It is noted that the accompanying drawings are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the present disclosure provide methods and test structures for one or more intermediate metal levels of an integrated circuit (IC). In particular, embodiments of the present disclosure can provide methods and structures for testing an IC by the use of one or more test circuits positioned within an intermediate metal level. Several metal levels in the IC can be manufactured up to the intermediate metal level and then tested. After the test is performed, the test circuit can be electrically shorted, bypassed, etc., by forming another plurality of metal levels of the IC, including a capping (final) metal level.

An example method according to the present disclosure can include, e.g., fabricating a first plurality of metal levels of the IC up to and including a targeted intermediate metal level of the IC structure. The targeted "intermediate metal level" can be one of a plurality of metal levels in the IC structure other than a capping (i.e., last manufactured) metal level of the IC structure. Before forming additional metal levels on the intermediate metal level, methods of the present disclosure can include performing a first functional test on a first circuit positioned within the intermediate metal level, e.g., by applying a test current, test voltage, etc., as an input to the partially-fabricated IC structure. After receiving a test response from the first circuit (e.g., a responsive voltage, current, resistance, and/or other quantities for indicating electrical behavior of the circuit), a second plurality of metal levels including the capping metal level can be fabricated to form a remainder of the IC structure. Embodiments of the present disclosure can then include performing a second functional test on a second circuit which includes the capping level of the IC structure, such that other electrical properties and/or components are tested. Embodiments of the various methods described herein can thereby produce test results for multiple components of an IC structure without significant penalties to area, fabrication cost, etc. That is, test structures normally embedded within the layers and having interconnects to outside the IC can be omitted. Test structures for permitting testing according to embodiments of the present disclosure are also discussed.

Figure 1:
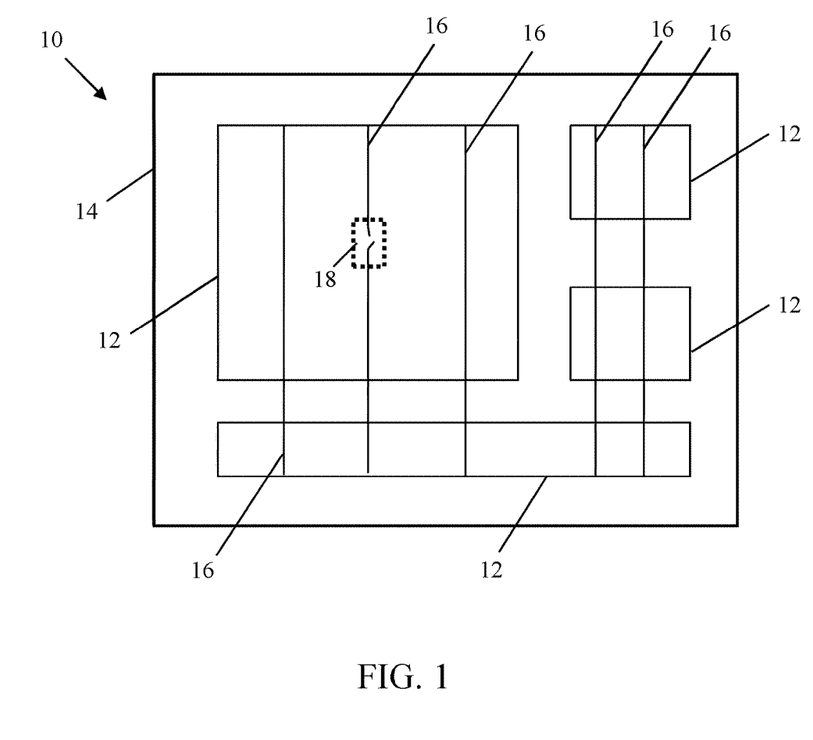
FIG. 1 shows a plan view of an intermediate metal level of a partially fabricated IC structure.

Referring to FIG. 1, a partial IC structure 10 according to embodiments of the present disclosure is shown. Partial IC structure 10 can be partitioned into a group of functional areas 12, several of which may be laterally interconnected by way of an intermediate metal level 14. Each functional area 12 can represent, e.g., a dedicated component of partial IC structure 10 such as a memory cell. Intermediate metal level 14 can be provided as a selected one of a plurality of metal levels in a resulting IC structure, e.g., a third, fourth, fifth, etc., metal level other than a capping metal level in a group of seven, ten, fourteen, twenty, etc., separate metal levels. Intermediate metal level 14 can include a plurality of metal wires 16 therein. During fabrication, one or more defects 18 (e.g., material and/or electrical discontinuities) may be present within metal wire(s) 16 of intermediate metal level 14 as a result of design constraints and/or manufacturing variations. An inability for electrical signals to travel end-to-end across corresponding metal wire(s) 16 within intermediate metal level 14 in response to, e.g., a test voltage, can indicate the presence of possible defect(s) 18 in intermediate metal level 14.

Figure 2:
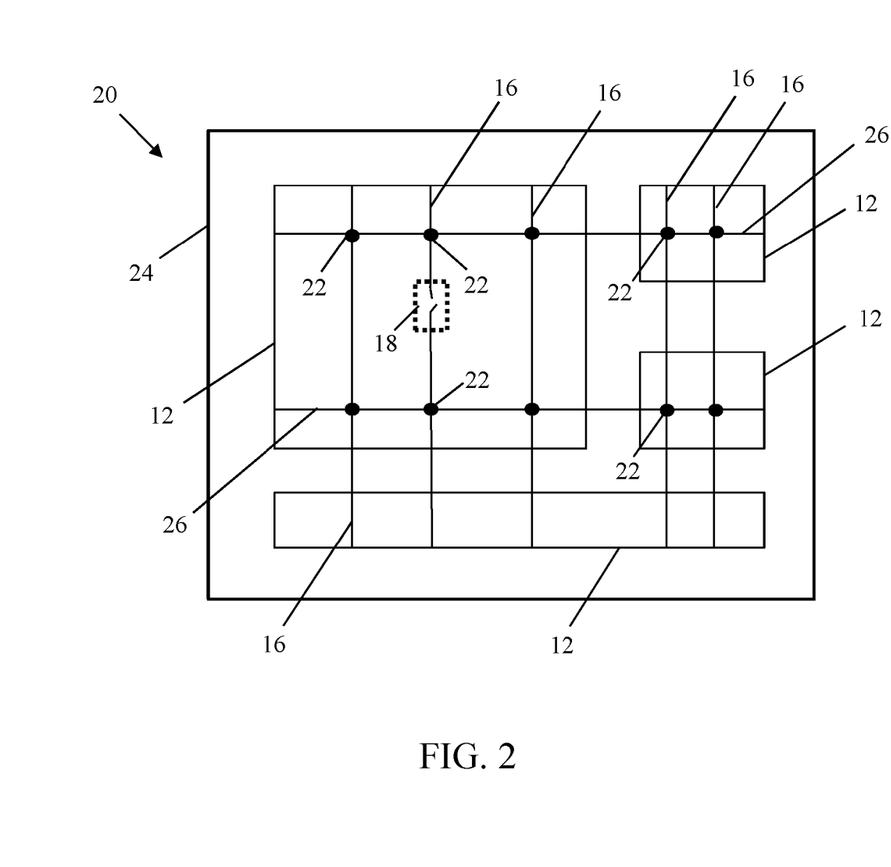
FIG. 2 shows a plan view of an IC structure with an intermediate metal level and a subsequently fabricated metal level.

Turning to FIG. 2, a completed IC structure 20 according to embodiments of the present disclosure is shown. After fabricating another plurality of metal levels, a group of connecting nodes 22 (representing, e.g., vias and intermediate metal wires) can couple metal wires 16 of intermediate metal level 14 (FIG. 1) to a capping metal level 24, directly or indirectly. Capping metal level 24 can include metal wires 26 therein coupled to metal wires 16 of intermediate metal level 14 through connecting nodes 22. Although capping metal level 24 is shown to be formed directly on metal wires 16, it is understood that any conceivable number of intervening metal layers may be positioned between intermediate metal level 14 and capping metal level 24. Metal wires 26 may enable, e.g., performance of completed IC structure 20 according to product specifications, but may also create one or more electrical short circuits within and/or around portions of intermediate metal level 14. As a result, test voltages applied to completed IC structure 20 may not identify the presence of defect(s) 18 within some functional areas 12. Embodiments of the present disclosure can circumvent this situation, identifying defect(s) 18 by applying test voltages to portions of intermediate metal level 14 and/or metal wires 16 before capping metal level 24 and/or other subsequently-formed metal levels (not shown) are formed.

Figure 3:
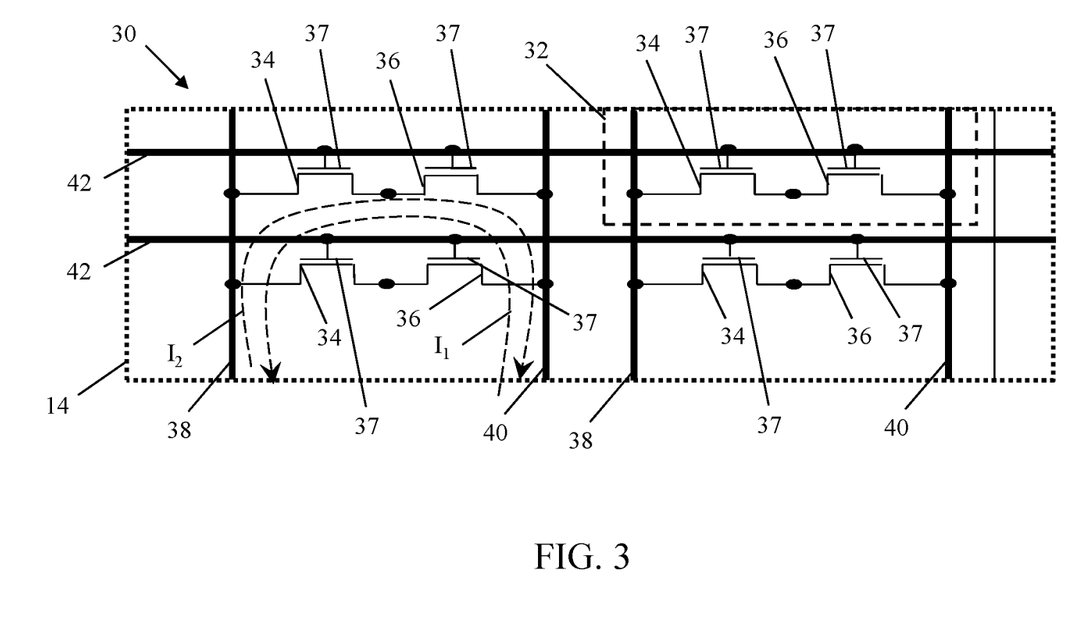
FIG. 3 provides a schematic view of a test structure in an intermediate metal level of an IC structure according to embodiments of the present disclosure.

Turning to FIG. 3, an example of a test structure 30 within intermediate metal level 14 according to embodiments of the present disclosure is shown. Intermediate metal level 14 of test structure 30 can include a group of memory cells 32 used in non-volatile random access memory (NVRAM) cells. Examples of NVRAM in conventional IC devices can include, e.g., flash memory, solid-state storage (SSS) units, etc. Where intermediate metal level 14 of test structure 30 is not yet connected to a subsequently-formed metal level, memory cells 32 may not include electrical contacts therein to metal wires in other levels. Each memory cell 32 can include a first transistor 34 and a second transistor 36. Each transistor 34, 36 can include a gate terminal 37 for controlling the ability for electrical currents to pass between its source and drain terminals. The respective source, drain, and gate terminals of each transistor 34, 36 are shown in accompanying FIGS. 3-6 by use of circuit diagram conventions known in the art.

First transistor 34 can be coupled to second transistor 36 directly through its source or drain terminal (e.g., at contacts thereof). The other source or drain terminal of first transistor 34 can be electrically coupled to a first bit line 38 of intermediate metal level 14. One source or drain terminal of second transistor 36 can be coupled to a second bit line 40 and the other can be coupled directly to the source or drain of first transistor 34. Each bit line 38, 40, can be positioned in alternating columns. The gate contact of each transistor 34, 36, in memory cell 32 can be electrically coupled to a word line 42. Word lines 42 in intermediate metal level 14 can be arranged in rows, e.g., perpendicularly to the various bit lines 38, 40. In addition, each word line 42 can be coupled to a shared source line (not shown) which transmits electrical inputs to test structure 30 from a power source. Although four memory cells 32 are shown in the section of intermediate metal level 14 of FIG. 3 as an example, it is understood that intermediate metal level 14 can include any desired number (e.g., hundreds, thousands, millions, etc.) of individual memory cells 32 therein.

The electrical response of test structure 30 can be different from other IC structures with additional metal layers formed on and electrically coupled to intermediate metal level 14. For example an input to memory cell 32 from first and/or second bit lines 38, 40 can cause an electrical current to pass through first and second transistors 34, 36 of memory cell 32. For one input polarity (e.g., a current induced by a positive voltage), a first current $I_1$ can flow from second transistor 36 to first transistor 34 as illustrated in FIG. 3. For opposite input polarities (e.g., a current induced by a negative voltage), a second current $I_2$ can flow from first transistor 34 to second transistor 36 as illustrated in FIG. 3. In either case, applying an input to memory cell 32 can indicate whether first and second transistors 34, 36 include defects (e.g., defect 18 (FIGS. 1-2)). The presence of possible defects can be communicated, e.g., by differences between the electrical current and a reference value, the ability or inability to control the flow of current through first and/or second transistors 34, 36, etc. Applying two or more test voltages across first and second bit lines 38, 40 (e.g., in the direction of currents $I_1$ and $I_2$) can serve as a first functional test of test structure 30. The first functional test can indicate the presence of possible defects within memory cell 32 or, in some cases, previously fabricated metal levels electrically connected to intermediate metal level 14.

Figure 4:
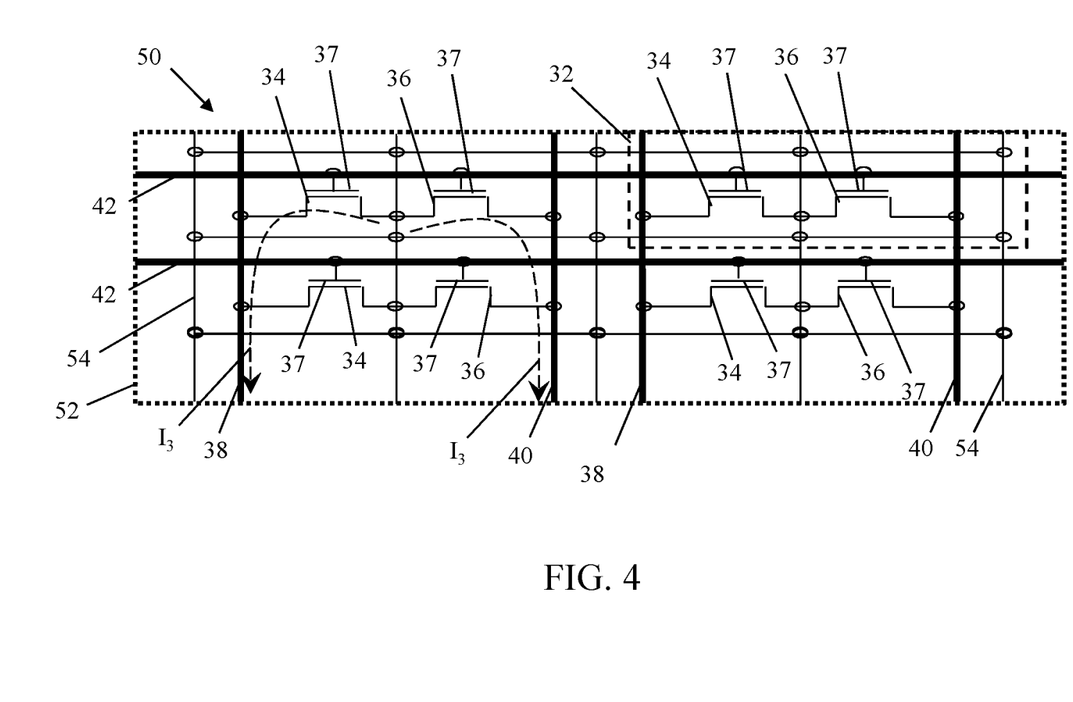
FIG. 4 provides a schematic view of an IC structure including a capping metal level according to embodiments of the present disclosure.

Turning to FIG. 4, an integrated circuit (IC) structure 50 including memory cell(s) 32 therein is shown. IC structure 50 can include a capping level 52, e.g., the last metal level fabricated in IC structure 50 during a full metalization process. FIG. 4 also illustrates several elements of intermediate metal level 14 (FIG. 3), vertically distal to capping level 52, to show electrical connections therebetween. Capping level 52 can include one or more metal wires 54 for electrically coupling various elements of IC structure 50 including one or more memory cells 32 in intermediate metal level 14. One or more metal wires 54 can be electrically connected to test structure 30 (FIG. 3) in intermediate metal level 14 (FIG. 3). More specifically, at least one metal wire 54 can be electrically coupled to the electrical intersection between source/drain contacts of first transistor 34 and second transistor 36 in memory cell 32, e.g., through a connecting via. Although one or more intervening metal levels can be positioned between capping level 52 and intermediate metal level 14, these levels and their corresponding elements are omitted from FIG. 4 solely for clarity.

Figure 6:
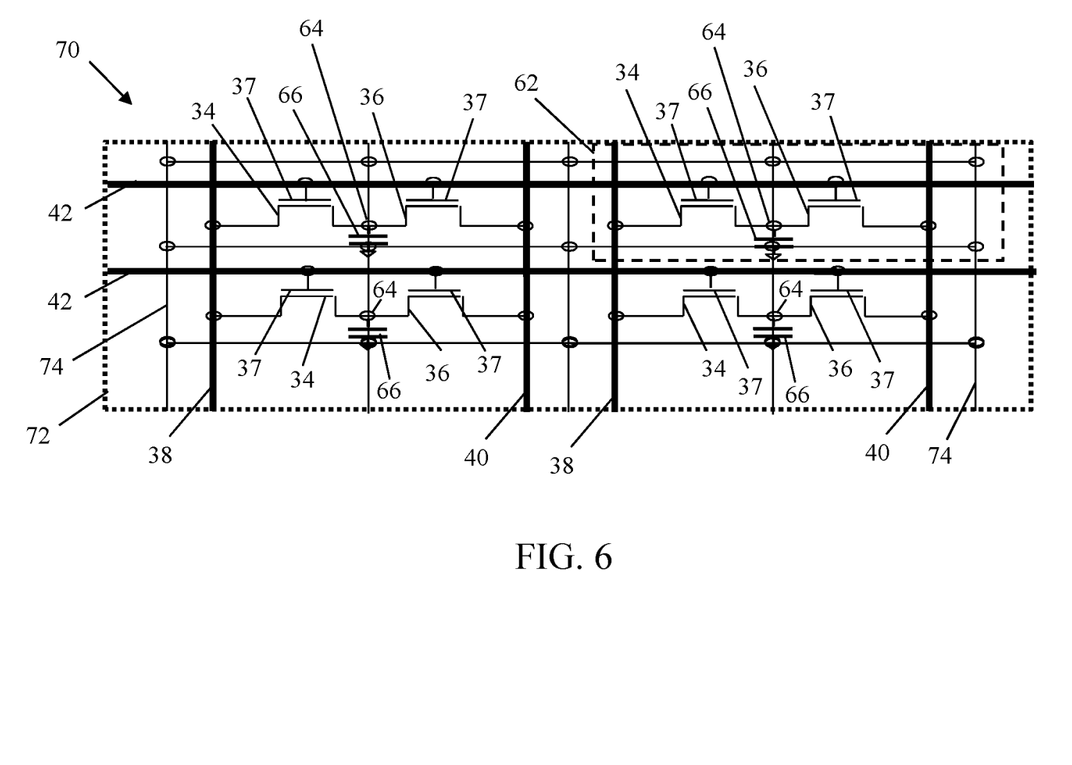
FIG. 6 provides a schematic view of an IC structure including a capping metal level coupled through a capacitor according to embodiments of the present disclosure.

Forming capping level 52 can create an electrical short to memory cell 32, e.g., by causing an electrical input to intermediate metal level 14 or capping level 52 to electrically bypass first transistor 34 and/or second transistor 36 when passing through memory cell 32. A second functional test can be performed on IC structure 50 with capping level 52 therein, e.g., to determine possible defects within capping level 52 and/or other metal levels formed subsequently to intermediate metal level 14. Performing a second functional test on IC structure 50 can include, e.g., applying a voltage to capping level 52 which may pass through intermediate metal level 14 to indicate the possible existence of defects within one or more elements of IC structure 50. In an example embodiment, a third current $I_3$ can flow from capping level 52 to intermediate metal level 14 while bypassing first and/or second transistors 34, 36. Due to the electrical connection with memory cell 32, the second functional test on IC structure 50 may not identify defects specific to electrically shorted elements of memory cell 32. However, the first functional test on test structure 30 (FIG. 3) with memory cell 32 can identify possible defects in memory cell 32 before complete fabrication of IC structure 50. Test structures 30 and IC structures 50 as embodied in FIGS. 3-4 may be operable to detect defects within an NVRAM circuit including memory cell 32 coupled to metal wires 54 of capping layer 52.

Figure 5:
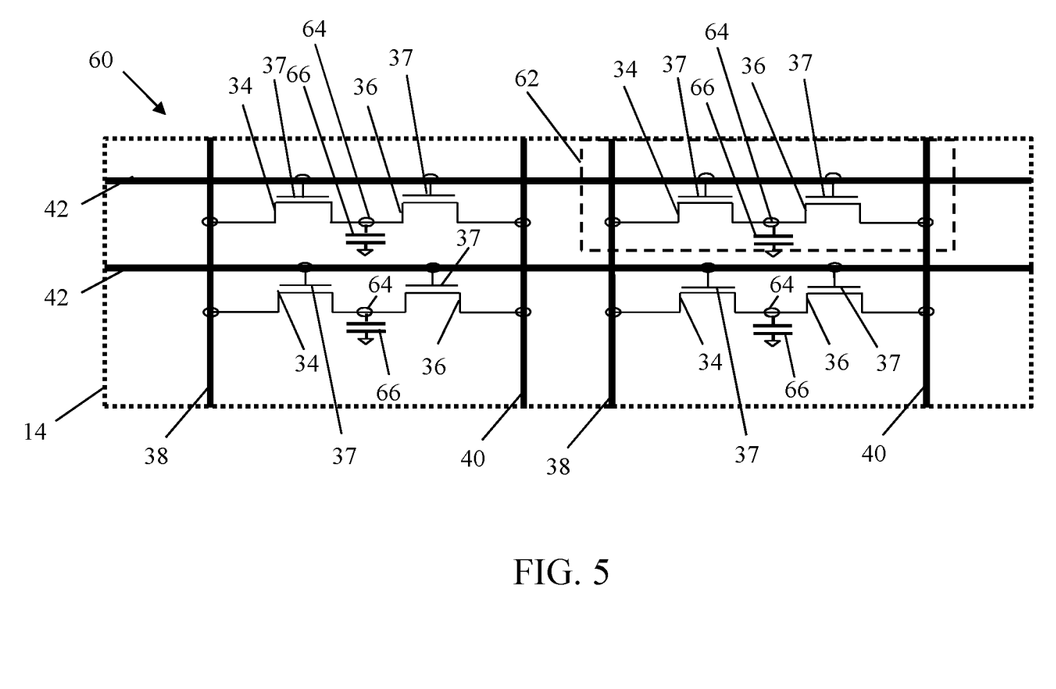
FIG. 5 provides a schematic view of another test structure in an intermediate metal level of an IC structure according to embodiments of the present disclosure.

Turning to FIG. 5, a test structure 60 according to another embodiment of the present disclosure is shown. Test structure 60 can be positioned within intermediate metal level 14 of a partially fabricated IC structure, with other metal levels being formed on intermediate metal level 14 in subsequent processes. Although test structure 60 is shown by example to be structurally independent from test structure 30 (FIG. 3), it is understood that test circuits 30, 60 can be positioned, e.g., in the same metal level, IC structure, etc. Test structure 60 can include several memory cells 62 therein, each including first and second transistors 34, 36 connected to a coupling node 64 at respective source/drain contacts, with the opposing source/drain contact of each transistor 34, 36 being connected to first or second bit line 38, 40. One terminal of a capacitor 66 can be coupled to coupling node 64, while the opposing terminal of capacitor 66 can be electrically grounded. Capacitor 66 can be electrically coupled to elements of other metal levels after their subsequent fabrication, and within test structure 60 may be configured to store a test bit (e.g., a predetermined amount of charge). Memory cell 62 with transistors 34, 36 and capacitor 66 therein can be used to form a one-time programmable memory (OTPM) circuit in an eventual IC product. An OTPM circuit generally refers to a form of digital memory in which data is stored in a permanent state (e.g., as a data bit, test bit, etc., in a capacitor) during production, testing, initial use, etc., of an IC product.

During operation, the electrical behavior and possible presence of defects in memory cell 62 can be evaluated by applying a first functional test to test structure 60. The first functional test applied to test structure 60 can include, e.g., applying a test voltage to one or more inputs of test structure 60, such that current enters memory cell 62 from bit lines 38, 40. The electrical response indicated from the test voltage can test one or more components of memory cell 62, such as transistors 34, 36 and/or capacitor 66. Although memory cell 62 may operate as an OTPM circuit after full metalization (e.g., by being subject to "write operations" to store test bits and "read operations" to indicate bits stored in capacitor 66), capacitor 66 is electrically grounded before full metalization of the resulting IC structure. As a result, an input to test structure 60 can indicate the value of a test bit stored in the capacitor (like a Dynamic Random Access Memory), e.g., by allowing current to pass through transistor(s) 34, 36 before entering the grounded capacitor 66. The ability or inability for electrical current to pass through first and second transistors 34, 36 can indicate the possible defects in each memory cell 62, in addition to checking the value of a data bit (e.g., a high or low voltage) stored in capacitor 66. Test structure 60 can include memory cells 62 in the form of partially-fabricated OTPM circuits in order to test portions of electrical hardware which cannot be tested by conventional techniques after complete fabrication of an IC product.

FIG. 6 provides a schematic view of IC structure 70 which incorporates memory cell 62 and includes a capping layer 72 fabricated after intermediate metal level 14 (FIG. 5). Capping layer 72 can include one or more metal wires 74 for providing an electrical connection between functional electrical elements (not shown) in capping layer 72. Capping layer 72, in addition, can provide electrical connections to and/or between multiple metal levels such as intermediate metal level 14 discussed elsewhere herein. One or more metal wires 74 can be electrically connected to coupling node 64 of one or more memory cells 62 through capacitor 66. Capacitor 66 becomes electrically connected to metal wire(s) 74 after capping layer 72 of IC structure 70 is formed. Although capacitor 66 is shown to be coupled to metal wires 74 in capping layer 72 in FIG. 6, it is understood that capacitor 66 can alternatively be electrically connected to a metal wire in a different and subsequently-formed metal layer in alternative embodiments. Capacitor(s) 66 of memory cell 62 can act as a "source line decoupling capacitor." That is, charge is stored in the capacitor and any voltage drop on the source line is compensated by the capacitor discharge.

In conventional testing regimes, the behavior of transistors 34, 36 and/or value of test bits in capacitor 66 can be tested by coupling a switch between coupling node 64 and metal wire 74. Compared with embodiments of the present disclosure, this approach requires a greater amount of surface area to be occupied by testing components due to the existence of an additional switch. Testing intermediate metal level 14 (FIGS. 3, 5) before fabricating capping layer 72, by contrast, can provide robust testing of memory cell 62 without forming and using additional testing hardware. Other components of IC structure 70 and/or memory cell 62 can be tested for possible defects by applying a second functional test (e.g., a different set of inputs applied to, e.g., word line(s) 42). The various test and/or IC structures 30 (FIG. 3), 50 (FIG. 4), 60 (FIG. 5), 70 described herein can generally allow methods according to the present disclosure to be implemented, and it is understood that other currently known and/or later developed structures can allow methods according to the present disclosure to be implemented. Methods according to the present disclosure are discussed in further detail elsewhere herein and generally include implementing a first functional test on a partially-completed IC structure including a test structure therein, and subsequently performing a second functional test on an IC structure with additional metal levels formed on the partially-completed IC structure.

Figure 7:
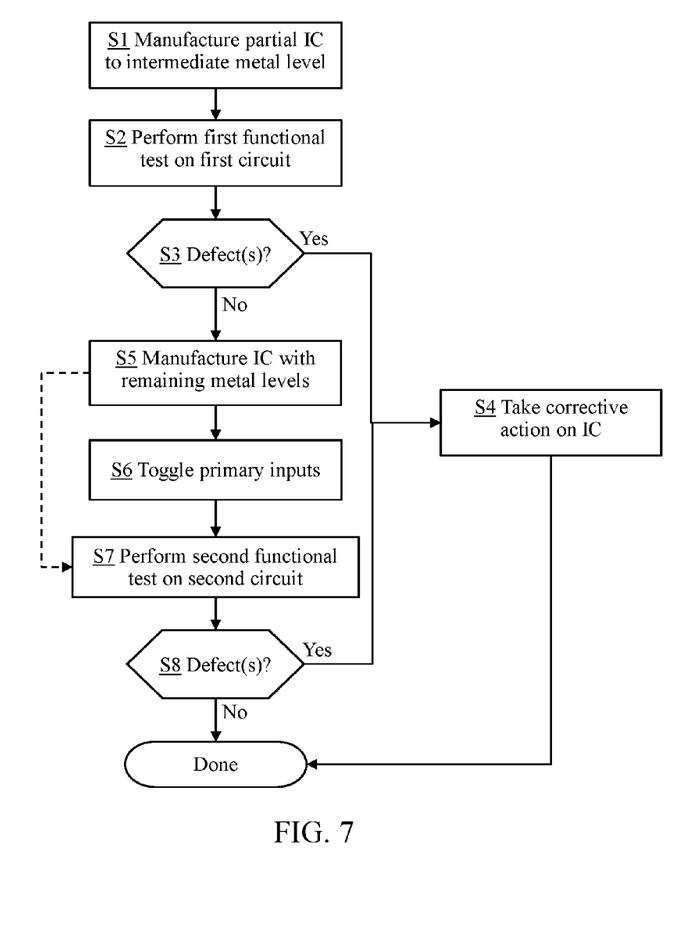
FIG. 7 provides an example flow diagram depicting illustrative methods according to embodiments of the present disclosure.

Referring to FIGS. 3, 4, and 7 together, an example flow diagram illustrating methods according to embodiments of the present disclosure is shown. Embodiments of methods according to the present disclosure are described herein by reference to FIGS. 3 and 4 solely for the purpose of convenience. It is understood that methods according to the present disclosure can be implemented, e.g., using any combination of the structures shown in FIGS. 3-5 (discussed elsewhere herein) and/or other similar or equivalent hardware structures. Methods according to the present disclosure can include, at step S1, manufacturing a partial IC including intermediate metal level 14 to form test structure 30. As described elsewhere herein, intermediate metal level 14 can be one of multiple levels in a partial or complete IC structure (e.g., IC structure 50) other than a capping metal level. For example, intermediate metal level 14 can be one of five metal levels, ten metal levels, fifteen metal levels, etc. Performing step S1 can yield, e.g., test structure 30 as shown in FIG. 3, test structure 60 as shown in FIG. 5, and/or another test structure to be incorporated within a fully-fabricated IC structure.

After forming intermediate metal level 14, but before forming additional metal levels coupled to intermediate metal level 14, embodiments of the present disclosure can include performing a first functional test on a first circuit (e.g., memory cell 32) of test structure 30 at step S2. The "first circuit" of test structure 30, as described herein, can generally refer to any circuit and/or hardware component of test structure 30 which becomes electrically shorted and/or not directly testable after fabrication of a subsequent metal layer. As described elsewhere herein, the first circuit can include memory cell 32, which in turn can be a portion of a partially-fabricated NVRAM circuit. In another example embodiment, the first circuit can include memory cell 62 (FIGS. 4-5) which forms a portion of a partially fabricated OTPM circuit. An example embodiment of step S2 can include generating an electrical test input to word line(s) 42 such that current passes through first and second transistors 34, 36 of memory cell 32. The first circuit being tested can therefore include first and second transistors 34, 36. The first functional test performed at step S2 can yield a response such as a measured value of current, resistance, etc., based on the electrical input.

Embodiments of the present disclosure can include determining whether one or more possible defects are present in the first circuit (e.g., memory cell 32) at step S3. For example, a high value of resistance measured across first and/or second transistors 34, 36 of memory cell 32 can indicate the presence of a broken wire, defective electrical connection, etc. therein. The presence of a defect within test structure 30 can indicate that one or more existing hardware components have been improperly fabricated and/or that one or more design shortfalls exist. The actual values indicative of a defect can vary depending on the IC and the variable being tested. Where the first functional test of step S2 indicates a possible defect (e.g., "Yes" at step S3), the flow can proceed to step S4 for taking a corrective action on the partially fabricated IC chip which includes test structure 30 therein. Corrective actions implemented in step S4 can include, e.g., discarding a particular product unit, repairing a defect, automatically determining design modification to the structure (e.g., with the help of modeling software), etc. Various embodiments of corrective actions implemented in step S4 are discussed in greater detail elsewhere herein. Following the corrective action in step S4, the method can include ("Done") before different actions are taken and/or test structure 30 is tested again by repeated implementation of steps S1 and/or S2.

Where the first functional test of step S2 indicates no defects in test structure 30 (i.e., "No" at step S3), the method can proceed to step S5 where additional metal levels can be fabricated on intermediate metal level 14 to form IC structure 50. Fabricating the remaining metal levels on intermediate metal level 14 can include fabricating capping level 52 (FIG. 4), 72 (FIG. 6) which electrically couples a subsequently formed metal wire to a node positioned, e.g., between source/drain terminals of first and second transistors 34, 36. Where IC structure 50 includes an NVRAM circuit with memory cell 32 therein, a subsequently-formed metal level 54 (FIG. 4) of IC structure 50 (FIG. 4) can be directly electrically connected to memory cell 32, e.g., between source/drain terminals of transistors 34, 36. Where the eventual IC structure includes an OTPM circuit including memory cell 62 (FIGS. 5-6) therein, a subsequently formed metal level 74 (FIG. 6) of IC structure 70 (FIG. 6) can be directly electrically connected to memory cell 62 through capacitor(s) 66 (FIGS. 5-6).

Fabricating additional metal levels to form IC structure 50 (FIG. 4) and/or IC structure 70 (FIG. 6) can create an electrical short in memory cell 32 such that additional functional tests will bypass one or more of its components (e.g., first and/or second transistors 34, 36). After manufacturing the remaining metal levels to form IC structure(s) 50 (FIG. 4) and/or 70 (FIG. 6), the method can proceed to step S6 of toggling one or more primary inputs to a pad interface IC structure(s) 50, 70, e.g., to test other electrical components therein. In an example embodiment, toggling primary inputs to IC structure(s) 50, 70 can include identifying a second test circuit (e.g., portions of capping level(s) 52 (FIG. 4), 72 (FIG. 6) and/or memory cell(s) 32, 62 (FIGS. 5-6)) to test for defects. Changing a pad interface to IC structure(s) 50, 70 can include, e.g., changing one or more source lines where an input voltage is applied. In alternative embodiments, the same primary inputs can be used for the first and second functional tests (e.g., as shown by the phantom process flow from step S5 to step S7).

At step S7, methods according to the present disclosure can include performing a second functional test on a second circuit within IC structure(s) 50, 70, after performing the first functional test in step S2, to test for possible defects and/or attributes not indicated by the first functional test. In an example embodiment, the second circuit tested in the second functional test can include portions of memory cell(s) 32, 62 (FIGS. 5-6) and capping level(s) 52 (FIG. 4), 72 (FIG. 6). Regardless of implementation, the second functional test can identify possible defects in components formed subsequently to intermediate metal level 14. Where possible defect(s) and/or other flaws are detected within IC structure(s) 50, 70 during the second functional test (i.e., "Yes" at step S8), the process flow can proceed to step S4 of taking a corrective action on the IC chip at step S4. Where the second functional test indicates no defects, design flaws, etc. (i.e., "No" at step S8) in the product unit being tested, the flow can conclude ("Done") such that the product can be finalized and/or tested in a subsequent process.

Figure 8:
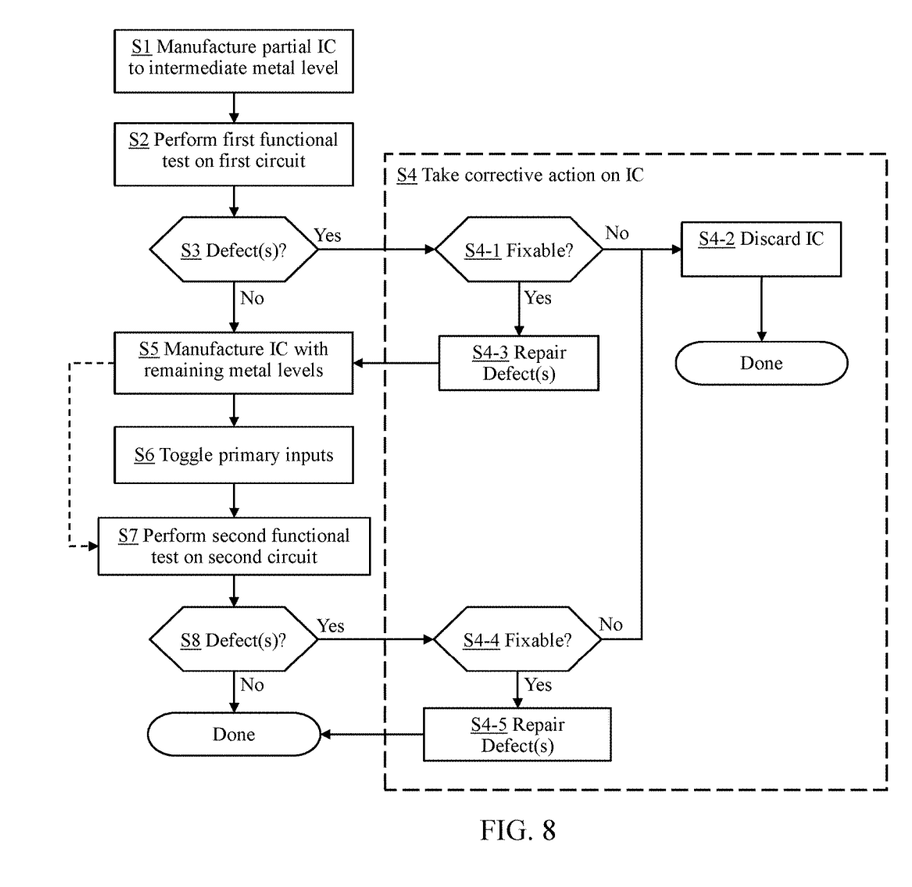
FIG. 8 provides another example flow diagram depicting illustrative methods according to embodiments of the present disclosure.

Referring to FIGS. 3 and 8 together, additional sub-processes of step S4 are shown to illustrate additional embodiments of the present disclosure. It is understood that the example process flow of FIG. 8 illustrates one manner in which step S4 can be implemented, and one or more of the various sub-processes of step S4 can be rearranged, omitted, etc., optionally with additional sub-processes included, in alternative embodiments. Where a possible defect is detected in intermediate metal level 14 (i.e., "Yes" at step S3), the flow can proceed to step S4-1 of identifying whether one or more of the possible defects is capable of being repaired, e.g., in a subsequent or remedial fabrication step. The determination in step S4-1 of whether the defect is fixable can include, e.g., manually or automatically comparing the response from the first functional test of step S2 with one or more reference characteristics (e.g., sample voltages, resistances etc.) corresponding to known fixable defects. Such defects can include, e.g., missing materials (e.g., defects 18 (FIGS. 1-2), improperly located parts, random errors caused by fabrication equipment, etc. Where the defect is determined to be fixable (i.e., "Yes" at step S4-1), the flow can proceed to step S4-3 of repairing the defect(s), e.g., by implementing remedial and/or additional fabrication steps to correct any underlying causes of the defects (e.g., forming or removing additional metals, electrically insulative materials, etc.) The flow can return to step S5 of manufacturing remaining metal levels of the IC structure after the defect is repaired. In the event that one or more of the defects detected in step S3 is not capable of being repaired (i.e., "No" at step S4-1), the flow can proceed to step S4-2 of discarding the partially-manufactured IC chip with test structure 30 therein. The structure can be discarded, e.g., by any currently-known or later developed process of destroying and/or discarding a process, such as those where one or more components are recycled and used in other products. The flow can then end ("Done").

Similar steps for characterizing and/or repairing defects can be implemented after performing the second functional test as is shown in FIG. 8. For example, where one or more possible defects are identified after performing the second functional test in step S7 (i.e., "Yes" at step S8), an IC fabricator can manually or automatically (i.e., with the aid of modeling tools or processes) determine whether the identified defect(s) are fixable in step S4-4. Where the defect(s) are capable of being repaired (i.e., "Yes" at step S4-4), the flow can proceed to step S4-5 of implementing additional fabrication techniques to repair the identified or possible defects (e.g., forming and/or removing additional metals, insulating materials, etc.). The flow can then conclude ("Done") after any applicable defects are repaired in step S4-5. Where one or more of the identified or possible defects is not fixable (i.e., "No" at step S4-4), the flow can proceed to step S4-2 of discarding the fabricated chip as discussed elsewhere herein.

Although embodiments of the method described herein can include, e.g., fabricating intermediate metal level 14 before forming capping level(s) 52 (FIG. 4), 72 (FIG. 6), it is understood that the structures and methods described herein can be modified and/or expanded to provide additional functionality. For instance, an IC structure can be fabricated to have two or more targeted intermediate metal levels 14 which can be tested before testing a fully fabricated IC. In this situation, steps S1-S3 can be repeatedly implemented as an iterative loop for each intermediate metal level 14 to test for defects therein, before proceeding to step S5 of fabricating the remaining metal levels. In a particular example embodiment, embodiments of the method described herein can include performing a separate functional test for each individual metal level of an IC structure, using modified forms of the process flow shown in FIGS. 7-8 and described herein.

The resulting IC structures described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method comprising:
fabricating a first plurality of metal levels including an intermediate metal level of an IC structure, the intermediate metal level being one of a plurality of metal levels in the IC structure other than a capping metal level of the IC structure;
performing a first functional test on a first circuit positioned within the intermediate metal level;
fabricating a second plurality of metal levels after performing the first functional test, the second plurality of metal levels including the capping metal level of the IC structure, wherein the fabricating of the second plurality of metal levels creates an electrical short to disable further testing of the first circuit; and
performing a second functional test on a second circuit positioned within the IC structure, after the fabricating of the second plurality of metal levels, wherein the second functional test on the second circuit excludes the first circuit.

2. The method of claim 1, further comprising:
determining whether the first plurality of metal levels includes a defect, based on the first functional test;
in response to determining that the first plurality of metal levels includes the defect, taking a corrective action on the IC structure before the fabricating of the second plurality of metal levels and the performing of the second functional test; and
in response to determining that the first plurality of metal levels does not include the defect, fabricating second plurality of metal levels of the IC structure and performing the second functional test.

3. The method of claim 1, further comprising toggling a set of primary inputs to a pad interface of the IC structure after the performing of the first functional test and before the performing of the second functional test.

4. The method of claim 1, wherein the first circuit comprises a portion of a non-volatile random access memory (NVRAM) circuit in the IC structure.

5. The method of claim 4, wherein the NVRAM circuit is electrically connected to a subsequently-formed one of the plurality of metal levels in the IC structure, after the forming of the capping metal level.

6. The method of claim 1, wherein the first circuit comprises a portion of a one-time programmable memory (OTPM) circuit in the IC structure.

7. The method of claim 6, wherein the OTPM circuit is electrically connected to a subsequently-formed one of the plurality of metal levels in the IC structure through a capacitor, after the forming of the capping metal level.

8. A method comprising:
fabricating a partial IC structure having a first plurality of metal levels, the first plurality of metal levels including a first metal level and at least one intermediate metal level;
electrically testing a first circuit within the partial IC structure, wherein the electrically testing of the first circuit includes applying a first test current and a second test current to the first circuit, the second test current having a reversed polarity relative to the first test current;
fabricating a second plurality of metal levels on the partial IC structure to yield the completed IC structure, wherein the second plurality of metal levels includes a capping metal level, and wherein the fabricating of the second plurality of metal levels on the partial IC structure yields an electrical short in the first circuit to disable further testing of the first circuit; and
electrically testing a second circuit within the completed IC structure after fabricating the second plurality of metal levels, wherein the electrically testing of the second circuit includes applying a test voltage to the second circuit, the second circuit being a circuit of the completed IC structure other than the first circuit, wherein the electrically testing of the second circuit excludes the first circuit.

9. The method of claim 8, further comprising toggling a set of primary inputs to a pad interface of the completed IC structure after the electrically testing of the first circuit of the partial IC structure, and before the electrically testing of the second circuit.

10. The method of claim 8, further comprising:
determining whether the first plurality of metal levels includes a defect, based on the electrically testing of the partial IC;
in response to determining that the first plurality of metal levels includes the defect, taking a corrective action on the partial IC structure before the fabricating of the second plurality of metal levels; and
in response to determining that the first plurality of metal levels does not include the defect, fabricating the second plurality of metal levels.

11. The method of claim 8, wherein the first circuit comprises a portion of a non-volatile random access memory (NVRAM) circuit in the completed IC structure.

12. The method of claim 8, wherein the first circuit comprises a portion of a one-time programmable memory (OTPM) circuit.

13. The method of claim 12, wherein the OTPM circuit is electrically connected to a one of the second plurality of metal levels in the completed IC structure through a capacitor, after the forming of the second plurality of metal levels.

14. The method of claim 1, wherein the second circuit includes a portion of the IC structure other than the first circuit.

15. The method of claim 1, wherein at least one of the second plurality of metal levels includes an intermediate wire structured to create the electrical short.

16. The method of claim 1, wherein the first test circuit comprises a first memory cell, and wherein the second test circuit comprises a second memory cell distinct from the first memory cell.

* * * * *